US009001580B1

(12) United States Patent
Horch

(10) Patent No.: US 9,001,580 B1
(45) Date of Patent: Apr. 7, 2015

(54) ASYMMETRIC DENSE FLOATING GATE NONVOLATILE MEMORY WITH DECOUPLED CAPACITOR

(71) Applicant: Synopsys, Inc., Mountain View, CA (US)

(72) Inventor: Andrew E. Horch, Seattle, WA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/097,113

(22) Filed: Dec. 4, 2013

(51) Int. Cl.
| | | |
|---|---|---|
| G11C 5/06 | (2006.01) | |
| G11C 5/02 | (2006.01) | |
| H01L 27/115 | (2006.01) | |
| G11C 16/14 | (2006.01) | |
| G11C 16/12 | (2006.01) | |
| G11C 16/34 | (2006.01) | |
| H01L 27/06 | (2006.01) | |
| H01L 29/88 | (2006.01) | |
| H01L 29/788 | (2006.01) | |
| H01L 29/423 | (2006.01) | |
| H01L 29/78 | (2006.01) | |
| H01L 29/417 | (2006.01) | |
| H01L 29/08 | (2006.01) | |
| H01L 49/02 | (2006.01) | |
| G11C 16/04 | (2006.01) | |

(52) U.S. Cl.
CPC .......... *H01L 27/11521* (2013.01); *G11C 16/14* (2013.01); *G11C 16/12* (2013.01); *G11C 16/3427* (2013.01); *H01L 27/0629* (2013.01); *H01L 29/88* (2013.01); *H01L 29/788* (2013.01); *H01L 29/42324* (2013.01); *H01L 29/7835* (2013.01); *H01L 29/417* (2013.01); *H01L 29/0847* (2013.01); *H01L 28/40* (2013.01); *G11C 16/0408* (2013.01); *G11C 16/0425* (2013.01)

(58) Field of Classification Search
CPC .................. G11C 16/0408; G11C 16/0425
USPC .................. 365/51, 63, 72, 185.05, 149, 175
See application file for complete search history.

(56) References Cited

U.S. PATENT DOCUMENTS

| 7,718,492 | B2 | 5/2010 | Horch |
| 7,800,156 | B2 | 9/2010 | Roizin et al. |
| 7,859,043 | B2 | 12/2010 | Pikhay et al. |
| 7,939,861 | B2 | 5/2011 | Horch |
| 7,948,020 | B2 | 5/2011 | Roizin et al. |
| 7,983,093 | B2 | 7/2011 | Horch |
| 8,194,468 | B2 | 6/2012 | Horch |

(Continued)

OTHER PUBLICATIONS

U.S. Appl. No. 13/954,383, Jul. 30, 2013, Andrew E. Horch.

*Primary Examiner* — Ly D Pham
(74) *Attorney, Agent, or Firm* — Fenwick & West LLP

(57) ABSTRACT

A nonvolatile memory ("NVM") bitcell includes a capacitor, an asymmetrically doped transistor, and a gated diode device. The capacitor, transistor, and gated diode device are each electrically coupled to different active regions and metal contacts. The three devices are coupled by a floating gate that traverses the three active regions. The gated diode device allows for erasure of an entire NVM memory more efficiently and using less substrate space than a similar device that uses a transistor. The asymmetric transistor, in conjunction with the capacitor, is used to both program and read the logical state of the floating gate. The capacitor and floating gate are capacitively coupled together, removing the need for a separate selection device to perform read and write operations.

21 Claims, 12 Drawing Sheets

(56) References Cited

U.S. PATENT DOCUMENTS

| | | |
|---|---|---|
| 8,674,422 B2 | 3/2014 | Horch |
| 8,853,761 B2 | 10/2014 | Horch |
| 2005/0030826 A1* | 2/2005 | Diorio et al. .................. 365/232 |
| 2008/0290401 A1* | 11/2008 | Yasui et al. ................... 257/324 |
| 2012/0033495 A1* | 2/2012 | Kato ........................ 365/185.05 |
| 2013/0056814 A1* | 3/2013 | Higuchi ........................ 257/314 |

\* cited by examiner

ASYMMETRIC DENSE FLOATING GATE NONVOLATILE MEMORY WITH DECOUPLED CAPACITOR

BACKGROUND

1. Field of Art

This disclosure generally relates to the field of nonvolatile memory, particularly non volatile memory bitcell layouts.

2. Description of the Related Art

Nonvolatile memory (NVM) refers to memory that persistently stores information bits when not powered. A nonvolatile memory bitcell (NVM bitcell) stores a single bit of data. Some types of NVM bitcells are implemented using transistors with floating gates. The amount of charge residing on a floating gate determines whether the bitcell is storing a logical "1" or a logical "0". The floating gate is referred to as "floating" because the gate is electrically isolated from the surroundings by an oxide or dielectric. Some NVM can store more than one state in the bitcell.

In order to expand applications and reduce costs of memory devices, it is desirable to accommodate a large number of bitcells in a given area. It is also desirable to decrease the cost of fabricating each bitcell by using standard complementary metal-oxide-semiconductor manufacturing processes ("CMOS processes"). Currently available memory devices include EEPROM and FLASH (and eFLASH), both of which have disadvantages. Currently, FLASH has a very small bitcell, but requires steps in addition to the standard CMOS process, which increases the cost of producing the bitcell and possibly changes the performance or characteristics of the produced devices. EEPROM is compatible with standard CMOS processes, but has a relatively large bitcell size, and thus is only suitable for low bit count memories.

SUMMARY

A nonvolatile memory ("NVM") bitcell includes a capacitor, an asymmetrically doped transistor, and a gated diode device (also referred to as a band to band tunneling (BTBT) device herein) each disposed in electrically isolated active regions within a substrate. The capacitor, the transistor, and the gated diode device are electrically coupled by a single floating gate that traverses the three active regions. The BTBT device is used to erase the device, allowing for faster page erasure, and thus allows for rapid testing and verification of functionality. The asymmetric transistor, in conjunction with the capacitor, is used to both program and read the logical state of the floating gate. The capacitor and floating gate are capacitively coupled together, removing the need for a separate selection device to perform read and write operations.

DETAILED DESCRIPTION

Figure 1A:
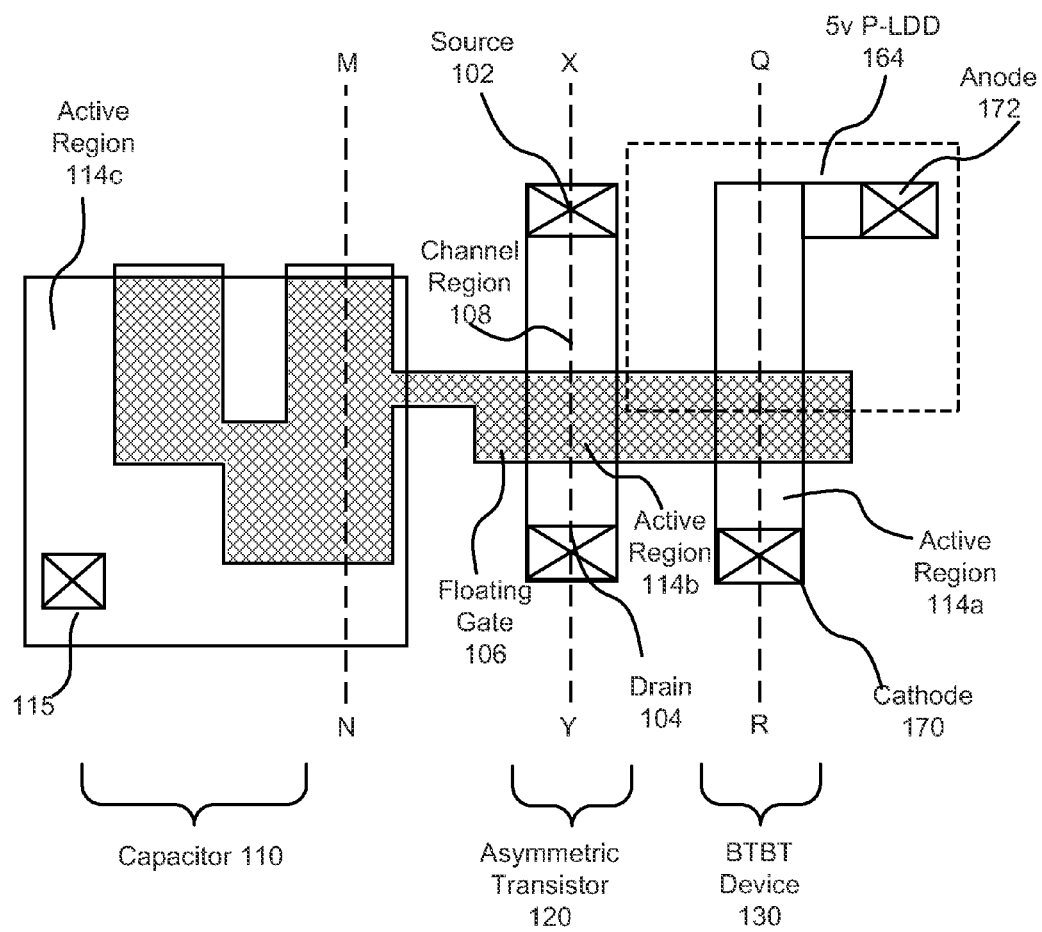
FIG. 1A illustrates a top view of a NVM bitcell according to one embodiment.

Embodiments relate to a nonvolatile memory ("NVM") bitcell (or bit, or bitcell) including three devices: asymmetric transistor, a capacitor, and a gated diode device (also referred to as a band to band tunneling (BTBT) device. In the bitcell, the three devices are linked by a single floating gate. In one implementation, the bitcell is erased using the gated diode device, and is read and programmed using the asymmetric transistor. The gated diode device allows for erasure of an entire NVM memory more efficiently and using less substrate space than a similar device that includes a transistor device that performs Fowler-Nordheim (FN) Tunneling to erase. By performing BTBT on a device other than the read/injection device the BTBT can be device can be optimized for performing BTBT. In addition, by having a separate BTBT device any charge trapping in the gate oxide that occurs during the BTBT operation will not affect the read path of the device. Which operation is performed at any given time is determined based on the voltages at the source and drain of the asymmetric transistor, based on the voltages at the gated diode device, and based on the voltage on the active region functioning as one plate of the capacitor.

A NVM memory device can be manufactured including a number of these bitcells (or bits). In one embodiment, the NVM memory device has between 12 k and 512 k bits, and is capable of being reliably used in applications preferring a write cycle endurance of anywhere from 1 to 100,000 writes over the lifetime of the NVM memory device.

The NVM memory device and its NVM bitcells described herein have advantages over existing NVM, FLASH, and EEPROM solutions. The NVM memory device has a higher bitcell density than existing EEPROM. The NVM memory device achieves a higher bitcell density per unit area/per unit volume than existing NVM by not requiring a separate selection (e.g., logic, transistor) device to choose which bits to erase or read. Instead, the NVM memory device applies voltages on the asymmetric transistor and the capacitor to choose which bitcells in the NVM memory device are read and programmed or read at any given time. The NVM memory device also simplifies erasing operations and testing, as the gated diode device of each bitcell shares power contacts with the gated diode devices of other bitcells on the same row. This helps save bitcell space, in addition to allowing for simultaneous erasure of all bitcells sharing that row, which significantly speeds testing of the NVM memory device for functionality. At an individual bitcell level, the bitcells of the NVM memory device are smaller than individual planar EEPROM bits and uses a simpler process than FLASH bits require.

The NVM memory device also has a lower manufacturing cost than a FLASH device because it can be manufactured using a standard complementary metal-oxide-semiconductor manufacturing logic process ("standard CMOS logic process") that is well understood in the art. Thus, NVM memory device does not require process steps in addition to the standard CMOS logic process in generating a FLASH-type device. Hence, NVM memory devices does not result in increase in the cost of manufacturing.

Overall Structure of NVM Bitcell

Figure (FIG.) 1A illustrates a top view of a NVM bitcell 100 according to one embodiment. For illustrative purposes, all examples are with respect to an N-type floating gate metal-oxide-semiconductor field effect transistor (MOSFET). However, the bitcell 100 may also be implemented as P-type MOSFET. The bitcell 100 includes a floating gate 106 that traverses three separate devices, a capacitor 110, an asymmetric transistor (AT) 120, and a gated diode device 130. The gated diode device 130 includes first active region 114a. The AT 120 includes the second active region 114b. The capacitor 110 includes the third active region 114c. The active region of a particular device may be shared with similar devices of other bitcells (not shown) in a NVM memory device. The active regions 114a, 114b, and 114c are isolated from each other by one or more nonconductive regions. Nonconductive regions may be constructed using oxides, shallow trench isolations (STI), deep trench isolations, or other similar mechanisms.

Generally, the floating gate 106 is a conductive layer of material. The floating gate 106 may be a planar layer formed on top of the substrate. Alternatively, the floating gate 106 may be implemented as a multigate transistor such as Fin field effect transistor (or FinFET) (not shown). The FinFET differs from a normal FET in that the floating gate wraps around the conducting channel between the source and drain, creating a structure that looks like a "fin". In the same or a different embodiment, the substrate in which the active regions are formed may be a ultra thin body silicon on insulator (UTB-SOI) having a thickness of approximately 5 nm. Such a design reduces short-channel effects and suppresses leakage by keeping gate capacitance in closer proximity to the whole of the channel.

From a top down perspective, the devices are positioned with respect to the floating gate such that the AT 120 is positioned between the capacitor 110 and the gated diode device 130. In a NVM memory device, this allows the first active region 114a of the gated diode device 130, specifically its cathode 170 and anode 172, to be shared between other gated diode devices of other bitcells. Similarly, this also allows the third active region 114c of the capacitor 110 to be shared between other capacitors of other bitcells. This increases the bitcell density of the NVM memory device.

With regard to the AT 120, the second active region 114b includes both the source 102 and the drain 104 of the AT. The source 102 and the drain 104 are separated by a channel region 108 underneath the portion of the floating gate 106 overlapping with the second active region 114b. The source 102 and drain 104 are formed in portions of the second active region 114b extending around the edge of the portion of the floating gate 106 overlapping with the second active region 114b. The second active region 114b includes a P-well doping underneath the floating gate 106, and also includes asymmetric dopings that differ between the source 102 and drain 104. The AT's dopings and cross sectional structure are further described below with respect to FIG. 1B.

The capacitor 110 is defined by two plates, the first plate being the third active region 114c, and the second plate being the portion of the floating gate 106 extending over the third active region 114c. The capacitor 110 may be formed in an undoped P-sub region (also referred to as a native region), it may also be formed in a doped P-well region also possibly including an N+ implant, it may be formed in a shallow N-well depending upon the implementation, or it may be formed with a PMOS device (e.g., inside an N-Well). Forming the capacitor 110 with a PMOS device is particularly effective in a process that includes a deep trench isolation. In cases where the capacitor 110 is formed with a well implant, the charge carriers of the well implant extend beneath an entirety of the third portion of the floating gate above the third active region. In cases where the capacitor 110 is formed in a native region, implants used to dope the substrate in the remainder of the bitcell are blocked during a fabrication process using one or more masks (not shown) that cover the third active region 114c. This helps ensure that charge carriers from other dopings (such as a –P-well doping of the AT 120) do not penetrate into the third active region 114c. The capacitor's 110 dopings and cross sectional structure is further described with respect to FIG. 1C below.

The gated diode device 130 is formed of the first active region 114a and the floating gate 106. The floating gate 106 extends at least partially over the first active region 114a. The first active region 114a includes two electrical contacts, an cathode 170 and a anode 172, coupled to opposite sides of the first active region 114a. The cathode 170 and anode 172 are separated by the portion of the floating gate 106 over the first active region 114a. The side (or portion) of the first active region 114a closer to the cathode 170 has a different doping than the side of the first active region 114a closer to the anode 172. The cathode 170 side active region 114a is doped with the same type of charge carriers as the source 102 of the AT 120. In contrast, the anode 172 side active region 114a is doped with the opposite type of charge carriers as the source 102 of the AT 120. In one embodiment of an NMOS type bitcell, the cathode 170 has a the N+ source/drain implant and a or some combination of LDD implants to form a very abrupt N/P diode under the floating gate near the cathode contact. The anode 172 has a P+ source/drain implant and may or might not have a p-type LDD implant as well. This causes the gated diode device 130 to behave like a diode when differing voltages are applied to the cathode 170 and anode 172. The gated diode device's 130 cross sectional structure is further described with respect to FIG. 1D below.

The bitcell 100 is associated with at least five separate electrical contacts that can apply voltage/current to the bitcell 100, thereby affecting the voltage level and amount of charge on the floating gate 106. The source 102 of the AT 120 is electrically coupled to a first contact, the drain 104 of the AT 120 is electrically coupled to a second contact, the capacitor 110 is electrically coupled to a third contact 115, the cathode 170 of the gated diode device 130 is electrically coupled to a fourth contact, and the anode 172 of the gated diode device 130 is electrically coupled to a fifth contact. The third contact can be shared between multiple capacitors of multiple bitcells, the fourth contact can be shared between multiple anodes of multiple gated diode devices of multiple bitcells, and the fifth contact can be shared between multiple cathodes of multiple gated diode devices of multiple bitcells.

Example Structure and Operation of Asymmetric Transistor

Asymmetric transistor 120 has different dopings at the source 102 and drain 104, allowing the AT 120, in conjunction with capacitor 110, to be used as both a read device and a programming device. FIG. 1B is a cross sectional view of an asymmetric transistor of the NVM bitcell taken along line X-Y of FIG. 1A in the second active region 114b, according to one embodiment. The cross section shown in FIG. 1B omits electrical contacts. Floating gate 106 sits on top of gate oxide 150. The floating gate 106 is surrounded by one or more spacers 158. The spacers may be made of an oxide or another nonconductive material. The gate oxide 150 rests on top of the second active region 114b. Active regions 114a through 114c may be a silicon substrate or a silicon-on-insulator (SOI) type substrate.

The second active region is doped to create a P-well 118 having approximately $10^{17}$ charge carriers (cc) per cubic centimeter ($cm^3$) beneath the floating gate 106. The source 102 and drain 104 surround the P-well 118, and each is attached to a separate electrical contact (not shown). When appropriate bias voltages are applied at the source 102 and drain 104 (e.g., when the AT 120 is turned "on"), a channel 108 of charge carriers is formed near the surface of the P-well 118 underneath the floating gate 106. Charge carrier flow is dictated by a number of factors including, for example, the voltages on the source 102 and drain 104, the number of charge carriers (e.g., electrons, holes) on the floating gate 106, the voltage on the capacitor 110, the doping of the source 102 and drain 104, the doping of the P-well 118, the thickness of the gate oxide 150, and other characteristics of the bitcell 100 such as dimensions of the various components and the materials used.

Figure 1B:
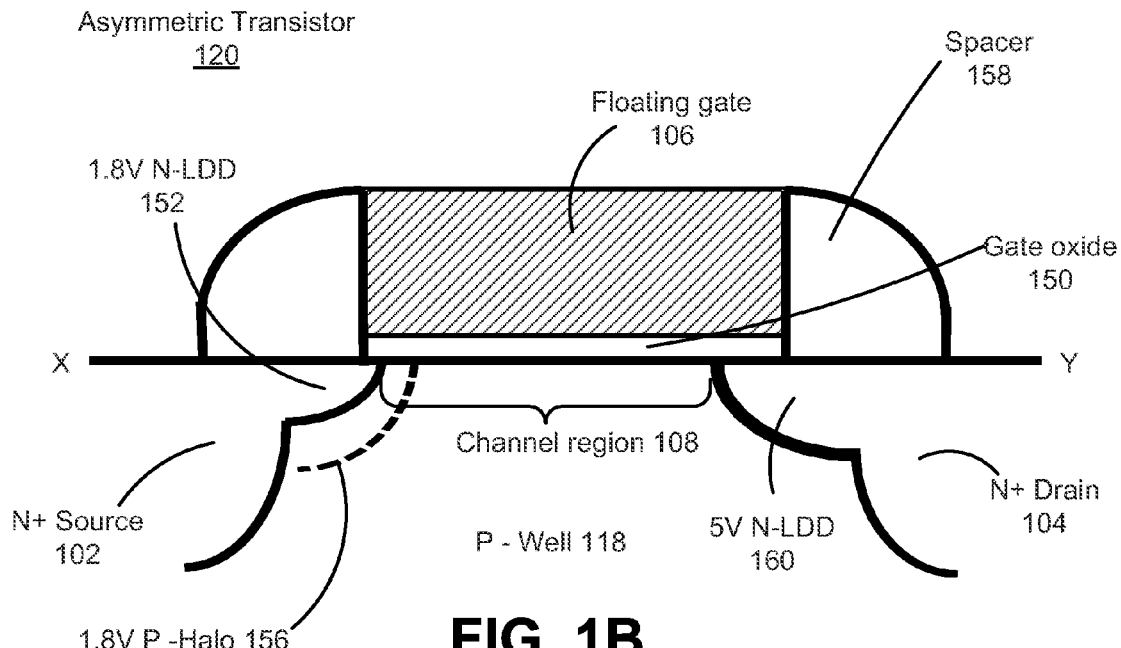
FIG. 1B is a cross sectional view of an asymmetric transistor of the NVM bitcell taken along line X-Y of FIG. 1A, according to one embodiment.

As introduced above with reference to FIG. 1A, the transistor 120 is asymmetric such that the source 102 and drain 104 have different dopings (or implants) of charge carriers from each other. There are commonalities, however, between the dopings. Both the source 102 and drain 104 include similar N+ dopings, having approximately $10^{20}$ cc/$cm^3$, where the N+ dopings extend at least partway under the spacers 158. Regarding the differences between the dopings, the embodiment illustrated in FIGS. 1A through 1D is for a hybrid 1.8V/5V bitcell. This means that some devices in the process may have a gate oxide of appropriate thickness between the floating gate and the substrate to support 1.8V operation, whereas other devices may have a gate oxide of appropriate thickness between the floating gate and the substrate to support 5V operation. The 1.8V devices and 5V devices also use different LDD implants. AT 120 specifically uses the gate oxide from a 5V implementation in order to have sufficient gate oxide thickness to support the desired retention charge on the floating gate. Generally, 1.8V gate oxides are so thin that direct tunneling can occur, causing unacceptable gate leakage.

To implement this asymmetry, the source 102 includes a 1.8V NMOS implant. The 1.8V NMOS implant typically includes two implants, either a lightly doped drain (LDD) or source-drain extension (S/D) implant, and a halo implant. The LDD and S/D extension implant are the same implant, the implant is called an LDD implant if the concentration of charge carriers is $10^{19}$ cc/$cm^3$, whereas if the charge carrier concentration is $10^{20}$ cc/$cm^3$ it is instead called a S/D extension implant due to the charge carrier concentration being similar to the source 102 and drain 104 regions. The halo implant is typically of the opposite polarity of the LDD or S/D extension implant. The halo implant typically has a charge carrier concentration of $10^{18}$ cc/$cm^3$, and is implanted with a higher energy and at a slight angle so that it forms a "halo" around the source 102 region within the substrate. The combined N-LDD (or N-S/D extension) and P-Halo implant provides a highly doped junction between holes and electrons that allows for improved channel hot electron injection (CHEI) or channel initiated secondary electron injection (CHISEL) (described further below).

The drain region 104 includes a 5V N-LDD implant. The 5V N-LDD implant is designed to handle a higher voltage that the 1.8V junction. The 5V N-LDD has a charge carrier concentration of $10^{19}$ cc/$cm^3$, and is implanted at either a higher energy and angle or is diffused with a heat step to grade the junction, thus allowing for higher voltages. The 5V N-LDD implant extends under the floating gate within the second active region much further than the 1.8V LDD (or S/D) implant. Although the embodiment illustrated is for a 1.8V/5V bitcell, other common voltage combinations include: 1.8V/3.3V, 1.2V/2.5V, 1.2V/3.3V, 1V/2.5V, 1V/3.3V and many others. The above described concept of configuring and mixing gate oxide thicknesses, implant types, and implant techniques to allow the AT 120 to operate with different voltages at the source 102 and drain 104 can be used in many other kinds of bitcells incorporating an AT 120.

Figure 2:
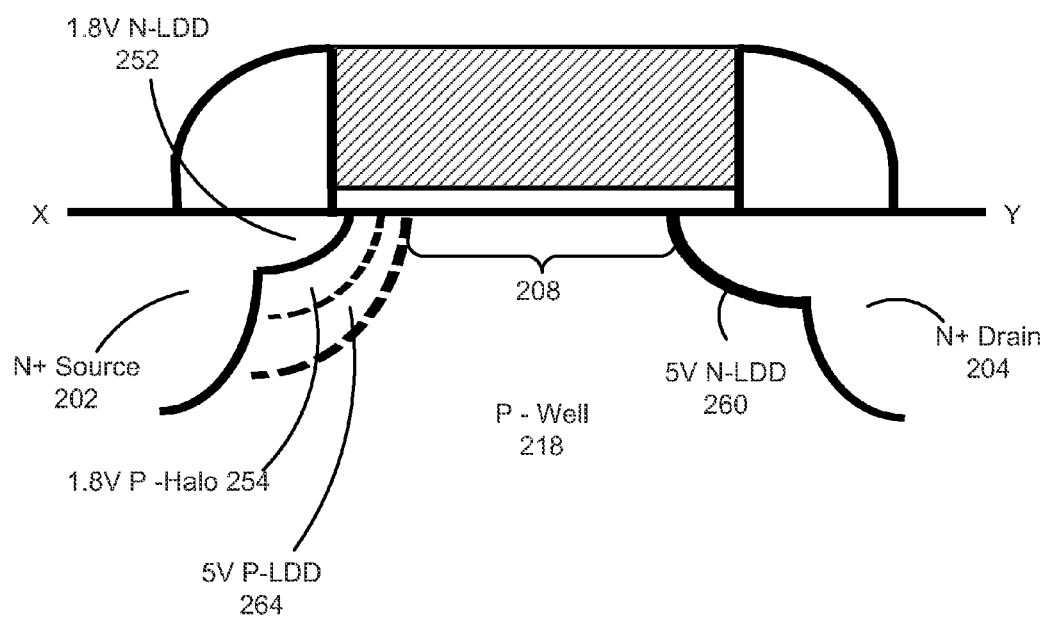
FIG. 2 is a cross sectional view of an alternate construction for an asymmetric transistor of an NVM bitcell according to one embodiment.

Other implementations of an AT 120 may have different dopings at the source and drain. For example, FIG. 2 is a cross sectional view of an alternate construction for an AT 220 of an NVM bitcell 200 according to one embodiment. As with source 102 of AT 120, source 202 of AT 220 includes a 1.8V N-LDD 252 and a 1.8V P-halo 254. Further, source 202 also includes a 5V P-LDD 264 implant. Drain 204 is similar to drain 104 and includes a 5V N-LDD 260. AT 220 is formed in a P-well 218 and has a channel region 208. In yet another implementation, a functional but less efficient NVM bitcell can be constructed using symmetric doping on the source and drain of the transistor. Due to the symmetry of doping, such transistor would not be referred to as an "asymmetric transistor", but would perform all the same functions as indicated herein.

Other implementations of AT 120 alter the P-Well 118. In some instances, the bitcell may operate more efficiently if the P-Well 118 has a higher doping concentration. The P-Well doping concentration may be increased by adding additional and/or different P-type implants that are not normally used in 5V NMOS devices. For example, the P-well may be doped to include both a 5V P-Well and a 1.8V P– implant. As another example, the P-Well 118 may be formed using al 0.8V implant rather than a 5V implant as described above. As another example, a portion of the P-well 118 may be formed using a 1.8V implant, and another portion of the P-well 118 may be formed with a 5V implant. As another example, the P-well may include a $V_T$ adjustment implant.

Example Structure and Operation of the Gated Diode Device

The gated diode device allows for erasure of an entire NVM memory more efficiently and using less substrate space than a similar device that uses a transistor. FIG. 1D is a cross sectional view of a gated diode device 130 of the NVM bitcell 100 taken along line Q-R of FIG. 1A in the first active region 114a, according to one embodiment. Above the substrate, the bitcell is the same as in FIG. 1B along this cross section, except for the shape of the floating gate 106. The first active region 114a may be formed in a P-well 118 as illustrated, in a native region, or in a shallow N-well as illustrated with respect to FIG. 5 described further below.

Within the first active region 114a, the cathode 170 side of the first active region 114a is doped with different implant/s having different polarities from the implant/s of the anode 172 side of the first active region 114a. Generally, the different polarity implants on the cathode 170 and anode 172 sides of the first active region 114a are what cause the gated diode device 130 to act like a diode. This diode-like structure improves the efficiency of BTBT for erasing the logical state of the floating gate 106.

The cathode 170 side of the first active region 114a includes an N+ implant 162 that extends partway underneath the spacers 158. This side of the first active region 114a also includes a low voltage NMOS implant that itself typically includes two implants, either an N-type LDD (e.g., 1.8V N-LDD implant 152) or a S/D implant, and a P-type halo implant (e.g., 1.8V P-halo implant 156). The anode 172 side of the first active region 114a includes a P-LDD implant without a halo 164, in this embodiment a 5V P-LDD. The anode typically also has a P+ Source/Drain implant as well 166. In another embodiment not shown, the anode has a P+ Source/Drain implant 166 and does not have an LDD implant of any kind Although the embodiment of the gated diode device 130 illustrated is for a 1.8V/5V bitcell, other common voltage combinations include: 1.8V/3.3V, 1.2V/2.5V, 1.2V/3.3V, 1V/2.5V, 1V/3.3V and many others. The above described concept of configuring and mixing gate oxide thicknesses, implant types, and implant techniques to allow the gated diode device 130 to operate with different voltages at the cathode 170 and anode 172 can be used in many other kinds of bitcells incorporating a gated diode device 130.

Figure 3:
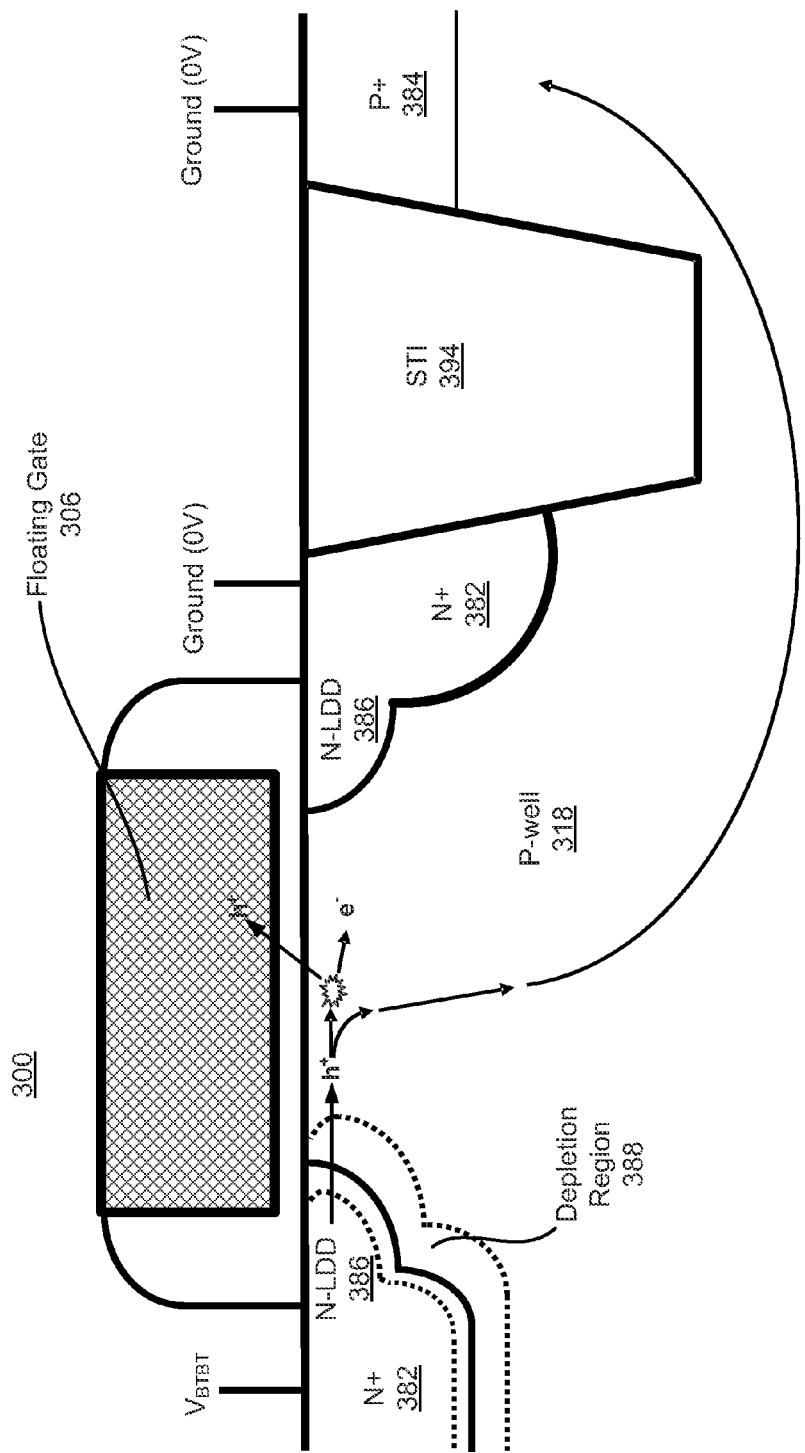
FIG. 3 is a cross sectional view of a bitcell that does not efficiently inject charge carriers onto a floating gate, according to one embodiment.

To provide a contrast to the gated diode device 130, FIG. 3 illustrates BTBT in a bitcell 300 according to another embodiment. The bitcell includes a floating gate 306 situated over an active region including a P-well implant 318. The active region is implanted with an N+ implant 386 that penetrates partially under spacers 358 on both sides of the floating gate 306, and an N-LDD implant 352 that penetrates partially underneath the floating gate 306 on both sides. At least one side of the active region is surrounded by a shallow trench isolation (STI) 382 to isolate the bitcell, where the other side of the STI has a second active region including a P+ implant 384. This second active region may be coupled to a tap.

During BTBT, one side of the bitcell 300 is held to a high positive voltage $V_{BTBT}$, the other side of the bitcell is held at ground (e.g., 0 V), and the second, tap active region is also held at ground. The high positive voltage $V_{BTBT}$ causes electrons to deplete from the N+ 382 and N-LDD implants 386, creating a narrow depletion region 388 underneath the floating gate 306. The high voltage also creates a strong electric field gradient at the boundary between the depleted N+ and N-LDD implants and the P-well in which they are embedded. The combination of the high electric field and the narrow depletion region allows carriers to tunnel from one band to another band. This is referred to as Band-To-Band-Tunneling (BTBT). When the carriers cross the depletion region the high electric field in the depletion region gives the carriers very high energy. Holes with high energy (hot holes) are injected into the P-Well 318 below the floating gate. Some of the holes go to the N+ S/D region held at ground 382, and some of the holes go to the P+ region 384. Hot holes can collide with elections creating electron hole pairs that can ricochet into a new direction. When a hole has enough energy and is moving toward the floating gate it can pass through the gate oxide and be injected onto the floating gate. This raises the voltage of the floating gate. The problem with bitcell 300, however, is that it is comparatively inefficient for performing BTBT. Although most of the holes travel near the silicon surface where they can be scattered onto the floating gate 306, a significant percentage of holes (e.g., 20%) travel down into the silicon and go around the STI to be collected at the p-tap 384. Any hole scattering that is far away from the floating (below the silicon surface) is highly unlikely to end up on the floating gate. This results in the device requiring more current to achieve a given floating gate voltage. The higher current need to program the floating gate is undesirable since gate injection from BTBT is already inefficient compared to FN Tunneling.

Figure 4:
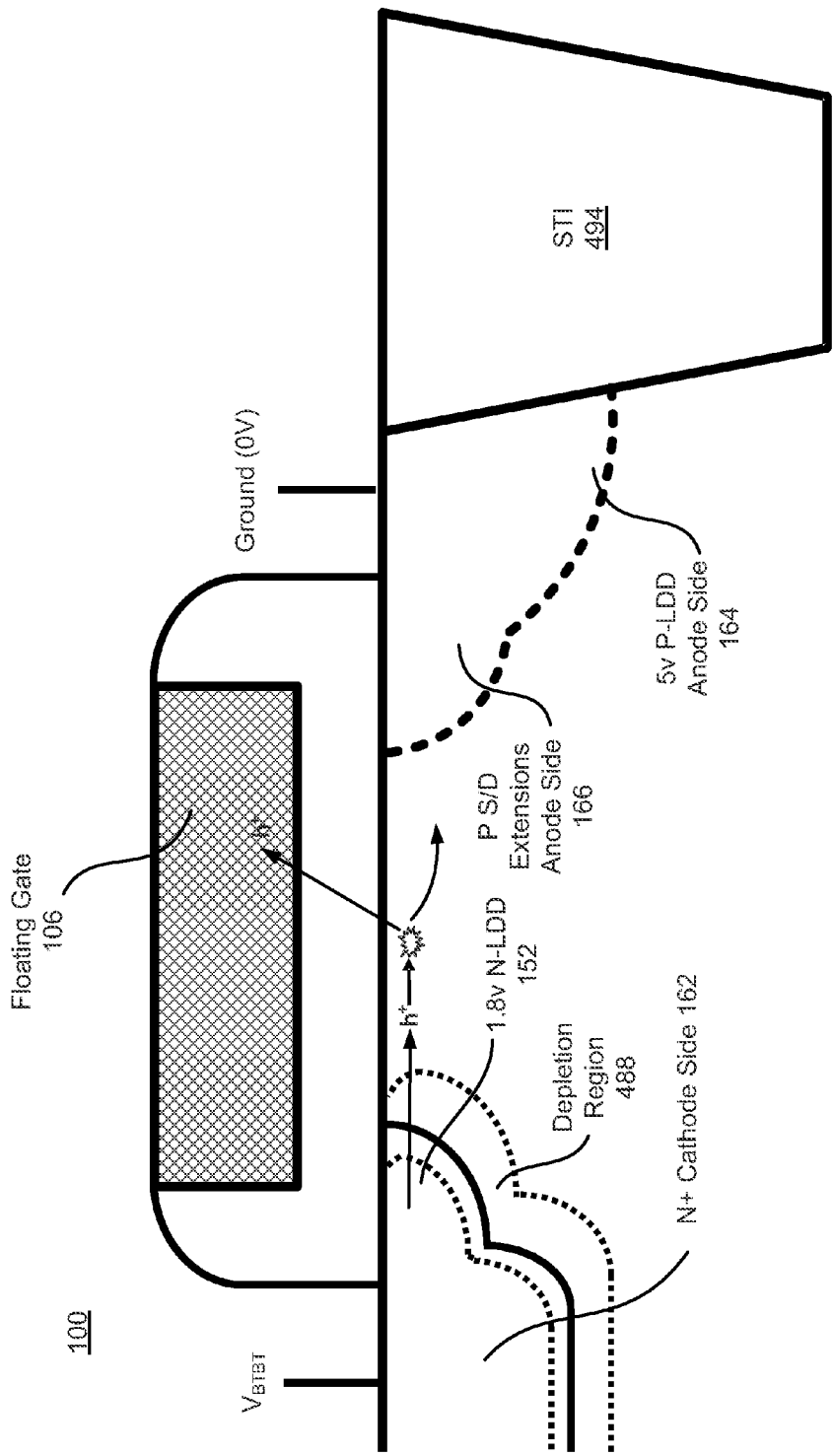
FIG. 4 is a cross sectional view of the operation of a gated diode device of the NVM bitcell according to one embodiment.

FIG. 4 illustrates BTBT in a gated diode device 130 of the NVM bitcell 100 according to one embodiment. Bitcell 100 resolves this inefficiency by having the anode 172 side of the first active region 114a be doped P type, in this embodiment it includes the 5V P-LDD 164 and P+ source/drain implants 166, also held at ground during BTBT. Having the anode 172 side include an implant of P-type polarity, or more generally of the same polarity as the charge carriers being induced to tunnel onto the floating gate 106, causes the current of charge carriers between the cathode 170 and anode 172 caused by $V_{BTBT}$ to stay near the surface of the first active region 114a. This increases the probability that scattered holes will scatter onto the floating gate 106 as desired. This, in turn, reduces the total current required to achieve BTBT resulting increased efficiency, particularly in comparison to bitcell 300.

The construction of FIG. 4 has other benefits as well. In contrast to bitcell 300, which required a second active region on the other side of an STI 394 and which is coupled to ground to act as a tap, instead the anode 172 side of the first active region 114a can act as its own tap. Thus, no extra active region and external tap is needed on the other side of the STI 494. This reduces the size of bitcell 100 resulting in considerable savings in a memory device including a large number of bitcells.

Figure 5:
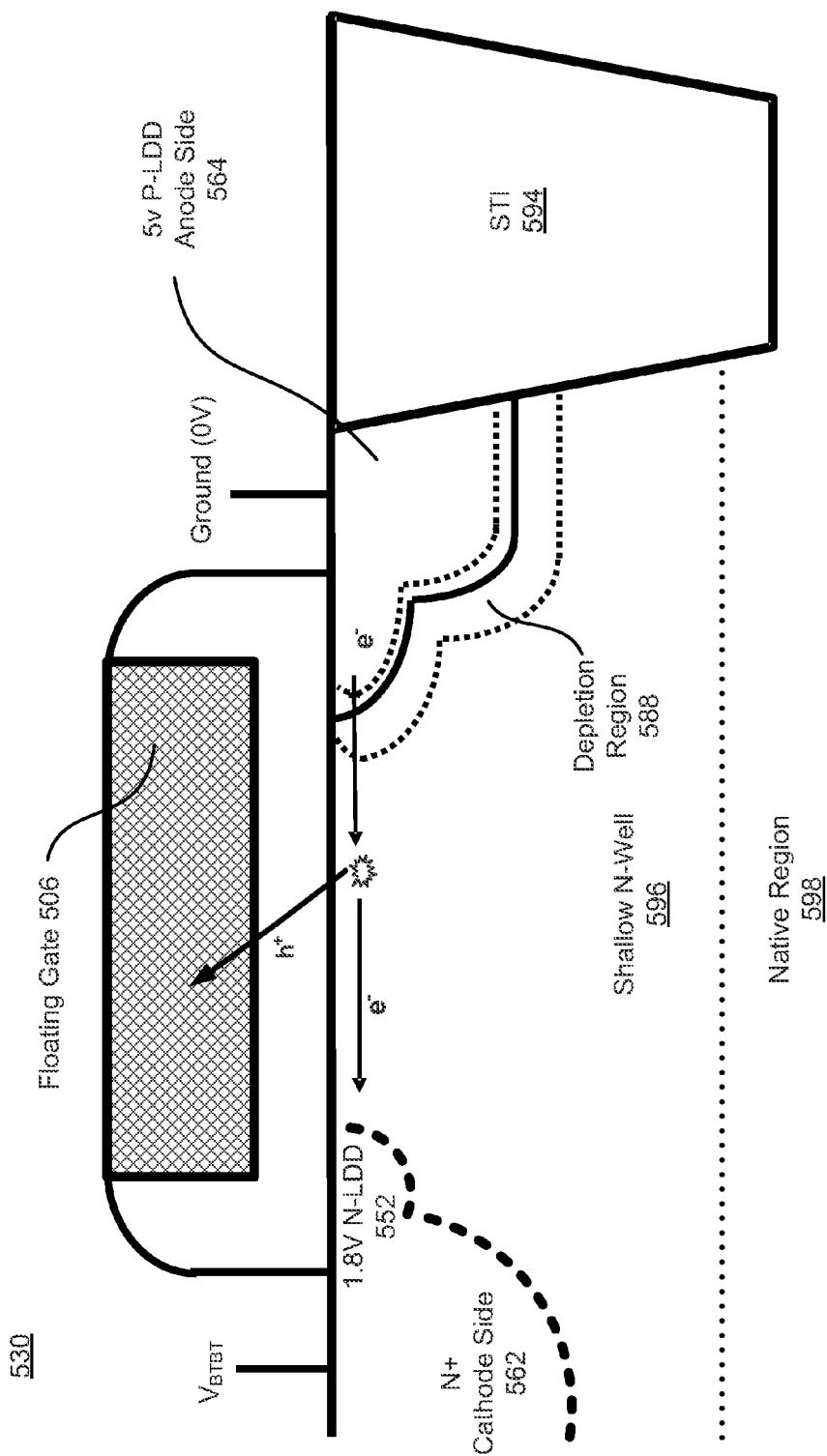
FIG. 5 is a cross sectional view of the operation of another construction of a gated diode device of the NVM bitcell according to one embodiment.

FIG. 5 illustrates an alternate construction of a gated diode device 530 that may be used in an NVM bitcell according to one embodiment. Gated diode device 530 is similar in construction gated diode 130, except that it includes a shallow N-well 596 rather than a P-well. A shallow well is a well where the depth of that well as implanted is above the depth of the isolation dielectric, typically a STI such as 594. By making the depth of the shallow well as implanted above the depth of the STI, the implant is effectively self-aligned to the STI since any dopant implanted into the STI is locked in the STI. The shallow N-well 596 may, for example, be formed in a native region 598. Alternatively, the shallow well can be implanted "on top" of another well so long as the shallow well's dopant concentration is significantly higher than the well it is counter doping. In another embodiment not shown the BTBT device is in a normal N-Well.

Similarly to gated diode device 130, BTBT is performed in gated diode device 530 by applying $V_{BTBT}$ to the cathode side 562 of the first action region, and the anode side 564 of the first active region 514a is held at ground. Alternatively, the cathode can be held at ground and the anode held or pulsed to a negative voltage. When these voltages are applied, the depletion region 588 is formed on the anode. Electrons trying to reach the high positive voltage are accelerated through the depletion region, and when the hot electrons collide with other elections, election hole pairs are created. The hot holes are attracted to the floating gate that is at a voltage lower than Vbtbt. Providing the hot holes have enough momentum and are moving toward the floating gate, the holes will tunnel onto the floating gate 506. Although the gated diode device 530 is described with respect to a N-well, the gated diode device will also function if a P-well is used instead and the implant's polarities are reversed.

Gated diode device 530 has several advantages. In construction of a memory device including many bitcells, the gated diode device 530 opens up options for laying out the bitcells relative to one another to conserve space, thereby reducing the overall size of the memory device. For example, each bitcell may be made smaller by incorporating a well tap into every bitcell on the cathode side of the gated diode device. As another example, in one embodiment different bitcells in a memory device may make use either gated diode device 130 or gated diode device 530 in a patterned fashion in order to more efficiently layout metal lines and contacts (not shown). More specifically, one bitcell of one row (or column) may include gated diode device 130 whereas another bitcell in that same row (or column) may include gated diode device 530. Another advantage of device 530 is that the vertical electric field between the shallow N-well at Vbtbt and the floating gate which should be near ground is much higher than in the prior bitcell. This higher electric field lowers the gate oxide barrier allowing for holes with lower energy to be injected on the floating gate, making the device more efficient.

Figure 6:
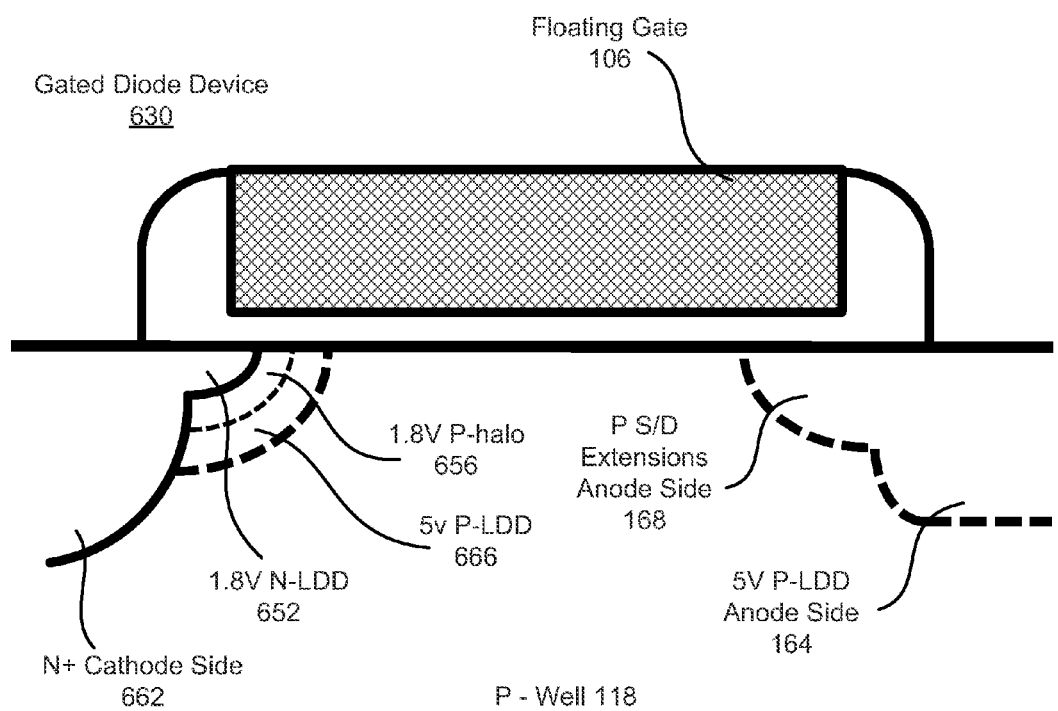
FIG. 6 is a cross sectional view of an alternate construction for the gated diode device of the NVM bitcell according to one embodiment.

FIG. 6 is a cross sectional view of another alternate construction for a gated diode device 630 of the NVM bitcell 100 according to one embodiment. Gated diode device 630 is similar to gated diode device 130, except that gated diode device 630 includes an additional implant 666 on the cathode side of the first active region. The additional implant is a 5 V P-LDD implant 666 that increases the number of holes that are present near the boundary between P-halo 656 and N-LDD implant 652. Adding additional holes in close proximity to these implants increases the strength of the electric field created during BTBT. The stronger electric field gives electrons additional energy to impart to holes, thereby making easier for those holes to tunnel onto the floating gate 106. Consequently, P-LDD implant 666 allows $V_{BTBT}$ to be reduced relative to a similar construction not including the implant, thereby increasing the efficiency of the NVM bitcell.

Figure 7:
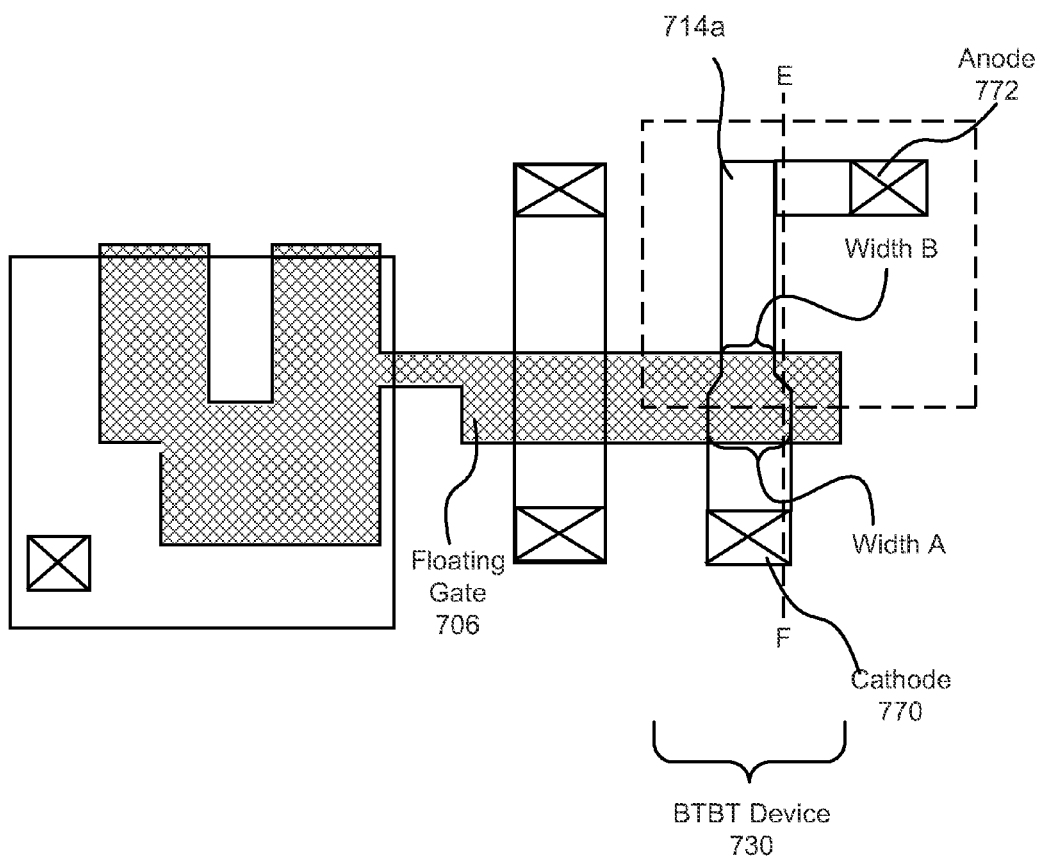
FIG. 7 is a top view of another alternate construction for the gated diode device of the NVM bitcell according to one embodiment.

FIG. 7 is a top view of an alternate construction for the gated diode device 730 of an NVM bitcell 700 according to one embodiment. In gated diode device 700, the anode 772 side of the first active region 714a has a width B that is narrower than a width A of the cathode 770 side of the first active region 714a. This construction has several advantages.

First, generally the larger the surface area of the first active region 714a beneath the floating gate 706, the greater the capacitive coupling between floating gate 706 and the first active region 714a. This capacitive coupling can be detrimental to the carrying out of BTBT to erase the floating gate 706, as some of the applied voltage $V_{BTBT}$ will capacitively couple to the floating gate 706, increasing its voltage and thereby making it more difficult for holes to tunnel onto the floating gate 706. Narrowing the width of the first active region 714 underneath the floating gate 706 decreases capacitive coupling, thereby decreasing this effect.

However, decreasing the size of the first active region 714a beneath floating gate 706 can be detrimental. The gated diode device's 730 performance depends on the implants in the first active region 714a under the floating gate 706, for example LDD and halo implants. Charge carrier implantation is an imprecise process, and variance can occur in charge carrier concentrations between different bitcells of a single device. Variance between bitcells is undesirable, as differences between bitcells can result in unexpected outcomes during operation. For example, differences in implantation can result in BTBT occurring on some bitcells but not others even where $V_{BTBT}$ is the same across all bitcells. The larger the first active region 714a is for implantation, the less variance will exist between implants of different bitcells.

Thus, if the first active region is uniform in size and perimeter from the anode side to the cathode side as in bitcell 100, there is a tradeoff to be made between capacitive coupling and implant variance. However, by varying the width A of the cathode 770 side of the first active region 714a to be different from width B of the anode 772 side of the first active region 714a, capacitive coupling can be reduced without necessarily sacrificing implant consistency. As the implants used to create the gated diode device 730, e.g., N-LDD and P-halo implants, are on the cathode 770 side of the first active region 714a, this extra width on the cathode 770 side is useful, and a similar width on the anode 772 side of the first active region 714a is unnecessary.

Figure 8:
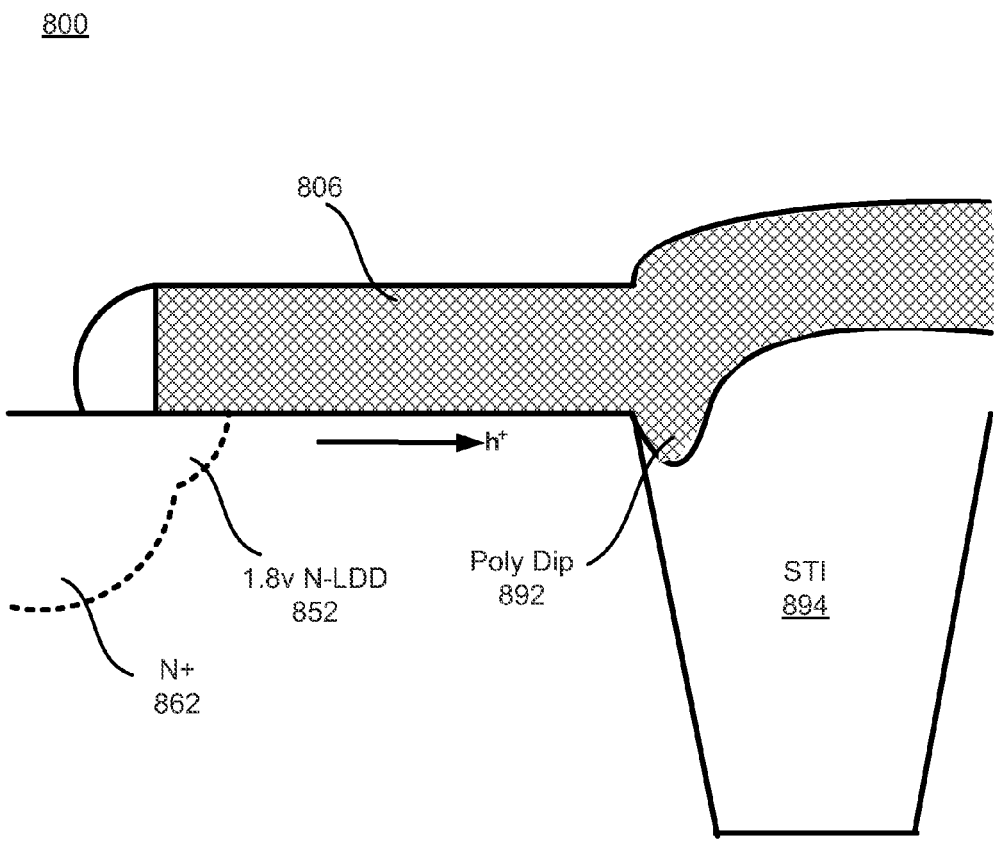
FIG. 8 is a cross sectional view illustrating a poly dip, according to one embodiment.

FIG. 8 illustrates a poly dip 892 that may be used to increase the efficiency of the gated diode device of an NVM bitcell 800, according to one embodiment. In this exemplary cross-section, one side of the bitcell 800 is as described above, including an N+ 862 implant and a N-LDD 852 implant. The CMOS logic process does not always result in a perfectly formed bitcell as drawn. An example of one common difference between a designed bitcell and a manufactured bitcell is referred to as a "poly dip" that may be formed at any junction between an active region and an STI 894 underneath a floating gate 806. An example of such a junction in bitcell 700 occurs along line E-F in FIG. 7. The poly dip 892 is a portion of the floating gate 806 that dips within the STI 894 at the junction with the active region where the dip 892 goes below the surface plane of the active region.

A poly dip 892 allows for improvement in the efficiency of BTBT. As described previously, BTBT occurs in the bitcell where a hole (or electron) receives enough momentum to tunnel vertically onto the floating gate located above the first active region. The presence of a poly dip 892 provides an alternative direction for a hole to tunnel onto the floating gate 806. If a poly dip 892 is present, a hole may tunnel onto the floating gate 806 not only vertically, but also horizontally onto the poly dip 892 portion of the floating gate 806. An advantage of this direction of tunneling is that it decreases the momentum such a photon needs to tunnel onto the floating gate. Overall, this reduces the voltage of $V_{BTBT}$ needed to perform BTBT, thereby increasing the efficiency of the bitcell.

Poly dips 892 may be present at any junction between the floating gate 806 and the STI edge 894. Generally, the longer the perimeter of the junction between the floating gate 806 and the STI 894, the more poly dip 892 surface area will be accessible to holes for tunneling. This leads to another benefit of the embodiment of bitcell 700 illustrated in FIG. 7, where the width of the first active region 714a changes between width A and width B underneath floating gate 706. Changing the width introduces more perimeter for the poly dip to affect hole tunneling. Further, at least some of that additional poly dip perimeter is oriented at angles other than parallel with respect to line E-F. This increases the likelihood that holes scattering at other angles will encounter the poly dip and thus tunnel onto the floating gate. This beneficially allows the voltage $V_{BTBT}$ to be lower, thereby increasing efficiency.

Note that although FIG. 7 illustrates a simple trapezoidal shape to transition the first active region 714a between width A and width B, other geometries and nonlinear perimeters for accomplishing this goal may be used. For example, there may be a right angle at the boundary where the width changes. Other angles and geometric shapes are also possible. Generally, larger angles increase the poly dip perimeter, which is beneficial for BTBT efficiency. However, higher angles and other complicated geometries can, in some cases, be more difficult to manufacture, which can result in reduced performance.

Example Structure and Operation of Capacitor

Figure 1C:
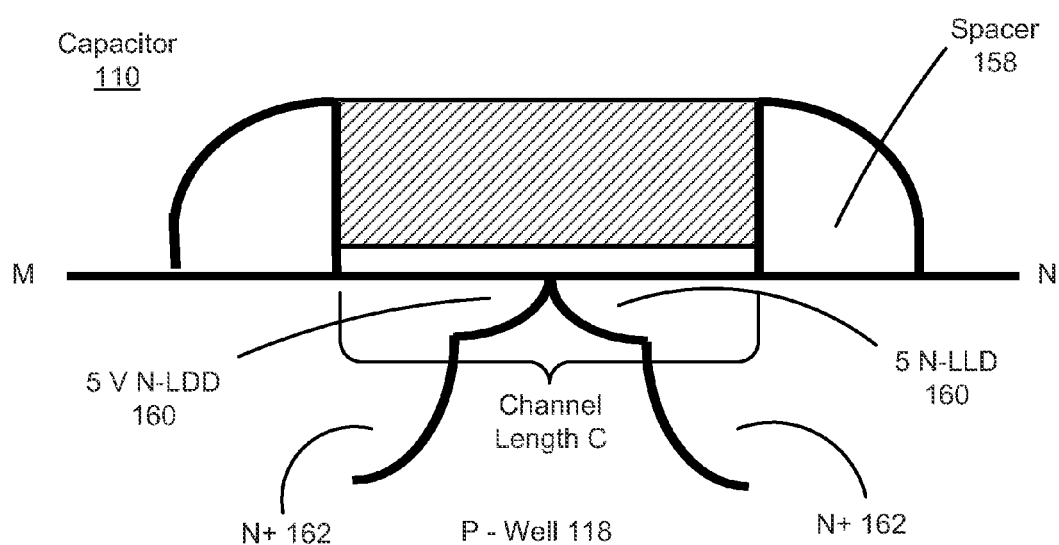
FIG. 1C is a cross sectional view of a capacitor of the NVM bitcell taken along line M-N of FIG. 1A, according to one embodiment.
Figure 1D:
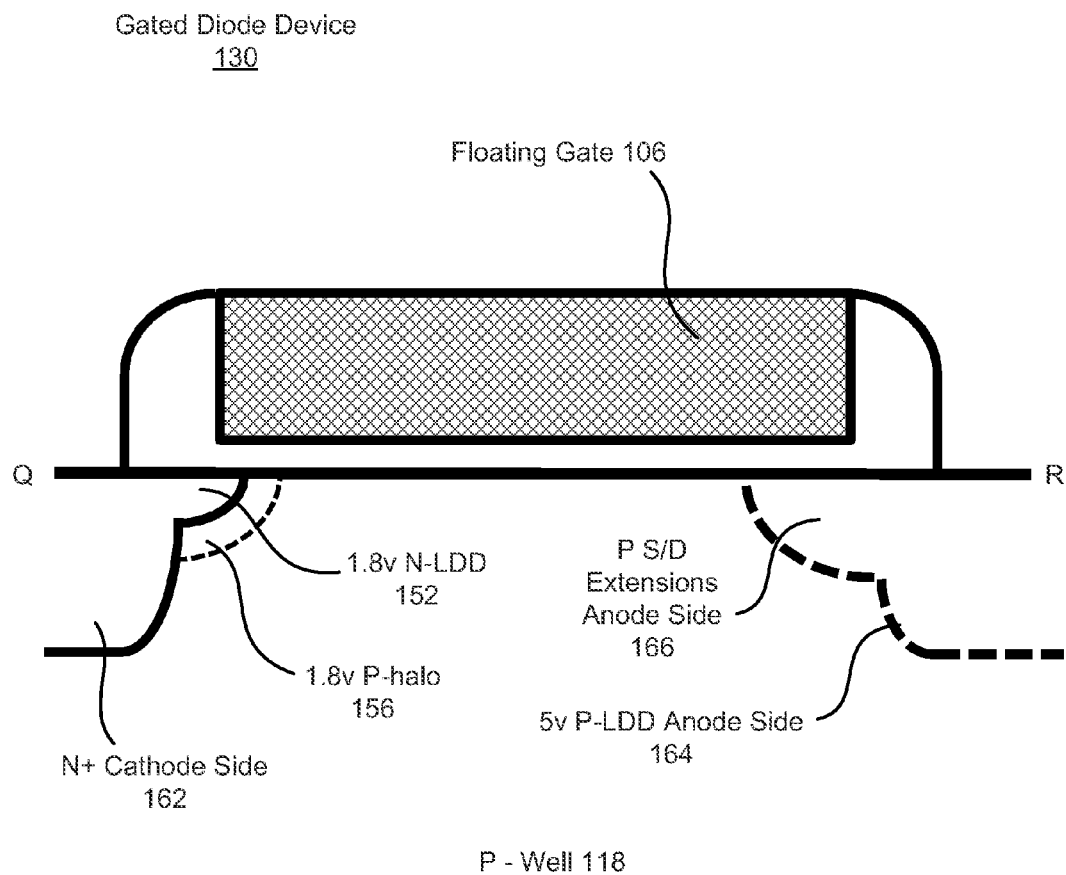
FIG. 1D is a cross sectional view of a gated diode device of the NVM bitcell taken along line Q-R of FIG. 1A, according to one embodiment.

FIG. 1C is a cross sectional view of a capacitor of the NVM bitcell according to one embodiment. FIG. 1C is taken along axis M/N from FIG. 1A in the third active region 114c. The portion of the capacitor 110 above the third active region 114c is the same as in FIGS. 1B and 1D along this cross section, with the exception of the width of the floating gate 106. Within the third active region 114c, the devices differ with regards to size and doping. The third active region 114c includes an N+ implant 162 that extends partway underneath the spacers 158 ideally on all sides. Due to the need to route the floating gate in poly from one active area to another it is generally impractical to completely surround the floating gate with N+ SD implants. The third active region 114c also includes a 5V N-LLD implant 160 that extends part way or all the way underneath the floating gate 106 on all sides except where the floating gate is used to connect the capacitor to the read device.

The capacitance of the capacitor 110 between the floating gate 106 and third active region 114c is determined by the extent of the overlap between the floating gate 106 and the third active region 114c. The portion of the floating gate 106 extending over the third active region 114c is shaped such that dopings of charge carriers into the third active region 114c are able to penetrate underneath that portion of the floating gate 106. Increasing the floating gate's size over the third active region 114c without also increasing the extent of the 5V LDD implant 160 does not measurably increase capacitive coupling. Therefore, to reduce bitcell size, implant 160 and the floating gate shape 106 are configured to ensure that LDD implant 160 extends under the floating gate 106 as much as possible, if not all the way underneath the entirety of floating gate 106. Ideally the LDD's merge under the gate.

When a positive voltage is applied to the third active region 114c, a depletion region is formed in the third active region 114c that grows in size as the voltage is increased. If the depletion region reaches the surface of the substrate, that portion of the capacitor is no longer capacitively coupled to the floating gate 106 due to the lack of charge carriers in the depletion region. Thus, there is a limit to how high in voltage the third active region 114c can be pulled before capacitive coupling falls off due to depletion. This in turn limits how high in voltage the floating gate 106 can be capacitively coupled by an applied voltage.

The capacitor may be formed in a native region rather than in a P-well. A native region is a portion of the substrate or wafer that is undoped from its ordering state from the manufacturer prior to deposition of the floating gate. Generally, wafers are purchased having a particular density of charge carriers (e.g., $10^{15}$ cc/cm$^3$). All other dopings change the charge carrier density in that region from the native region's original density. In some processes the native region is replaced by a very low doped region with charge carrier densities less than or equal to $10^{16}$ cc/cm$^3$. Masks and are used to form native regions, and in practice the area of the substrate underneath the mask may extend laterally or horizontally to encompass other bitcells as described further below.

The extent of the masks determines the size of the native regions. As the masks extend past the edge of the active regions they enclose, there are regions of the substrate that are native regions that are not part of the active region (not separately labeled). These regions are referred to as non-active native regions or isolation regions. The distance between the edge of an active region that is a native region and the edge of the non-active native regions as determined by the mask serves to electrically isolate the active region from other doped active regions. The electrical isolation afforded by these non-active native regions improves the performance of the native regions at the expense of costing additional space to provide that isolation. Performance may be measured, for example, based on the voltages that can be applied to the active regions (e.g., to the capacitor) without inducing diode breakdown. For example, increased isolation (e.g., increased non-active native region) allows for higher voltages without inducing diode breakdown. During manufacturing, a tradeoff is made between the size of any non-active native regions and the performance desired out of the device.

Forming the capacitor 110 in a native region advantageously allows for larger capacitive surface areas, because the native region lack counter-doped charge carriers. The presence of fewer counter-doped charge carriers forestalls the growth of the depletion region under an applied voltage. Thus, the portion of the floating gate over the third active region 114c can be comparatively large while still providing functional capacitive coupling at high voltages. In contrast, forming the capacitor in a P-well region provides a large number of counter-doped charge carriers to accelerate the growth of the depletion region in the presence of an applied voltage. To form an equivalently functional capacitor, the floating gate 106 is generally reduced in width relative to its native region counterpart to ensure that additional 5V N-LDD charge carriers can be implanted all the way under the narrowed floating gate 106 to counteract the P-well counter-dopants.

NVM Bitcell Operation

The NVM bitcell uses BTBT on the gated diode device to erase the floating gate, and uses channel hot electron injection (CHEI) or channel initiated secondary electron injection (CHISEL) on the AT to program the floating gate. In a PMOS implementation, impact ionized hot election injection (IHEI) may instead be used to program the floating gate. The bitcell is read by activating the AT. The following description describes operation of a N-type bitcell using CHISEL to program. However, the same principle applies equally to a N-type CHEI or P-type bitcell IHEI implementations.

One of many advantages of the NVM bitcell is that because the capacitor is decoupled from both the source and the drain, the capacitor can be used to adjust the voltage on the floating gate without affecting the voltages at the source, the drain, the anode, or the cathode. Due to the capacitance between floating gate and the third active region, the floating gate voltage will be a proportion of whatever voltage is applied at the third active region. For example, if there is a 50% capacitive coupling between the floating gate 106 and the third active region, then the floating gate voltage will coupled by 50% of the voltage change applied to the third active region (i.e., at the metal contact electrically coupled to the third active region).

Table 1 set forth below illustrates read, write, and erase operation for an example N-type bitcell embodiment.

TABLE 1

Bitcell 100 Operation

| Operation | $V_{BTBT}$ | Drain (bitline) | Source (wordline) | Capacitor | Floating Gate Voltage in idle (all contacts at 0 V) |
|---|---|---|---|---|---|
| Erase | 8 V | 0 V | 0 V | 0 V | −3 V => −1 V Inject holes onto floating gate |

TABLE 1-continued

Bitcell 100 Operation

| Operation | $V_{BTBT}$ | Drain (bitline) | Source (wordline) | Capacitor | Floating Gate Voltage in idle (all contacts at 0 V) |
|---|---|---|---|---|---|
| Program | 0-2 V | 2 V or 7 V | 7 V | 12 V | −1 V => −3 V For rows where the drain is 2 V, add electrons to floating gate (CHISEL) |
| Read | 0 V | 0 | 1.2 V | 3 V | −1 V or −3 V |

To erase the floating gates on a particular row of bitcells, a high positive voltage $V_{BTBT}$ (e.g., 8 V) is applied to the cathode (or, alternatively, a high negative voltage is applied to the anode) causing the gated diode device to become reverse biased. This large positive voltage is sufficient to cause holes to tunnel from the first active region onto the floating gate, thereby increasing its voltage. During erasure, all other contacts are maintained at or near zero volts.

To program a floating gate on a particular row via CHISEL, the source and drain voltages are separately adjusted to create a voltage drop (or program differential voltage) between the source and the drain. For example, the source is set to a high voltage, for example 7 V, and the drain is set to a low voltage, for example 2 V. The voltage drop establishes a high intensity electric field between the source and the drain across the channel region. The electric field causes electrons to accelerate from the source towards the drain. Some of the secondary electrons will have enough energy to be injected onto the floating gate. For those bitcells on the row that are not being programmed, the drains (columns) of those bitcells are instead held at a similar voltage as the source (e.g., 7 V, or reasonably close thereto). In contrast to the bitcells being programmed, no high intensity electric field is generated between the sources and drains of these bitcells, and thus electrons generally do not achieve the energy needed to be injected onto the floating gate.

During programming, the floating gate is coupled to a high voltage using the capacitor. For example, the third active region of the capacitor is coupled to 12 V. The higher the voltage, the stronger the induced vertical electric field, and consequently the more efficiently charge carriers are injected. By independently raising the floating gate voltage through capacitive coupling with the capacitor, CHISEL (and CHEI) efficiency is increased. Maintaining high CHISEL efficiency decreases the amount of current needed by the bitcell to perform CHISEL and therefore to program the floating gate. Decreasing the amount current needed to perform program operations means that CHISEL can reduce the size of a charge pump that produces currents high enough to perform CHISEL. Further, in some embodiments, a charge pump may be used only to drive the capacitor (e.g., rather than both the capacitor and the AT transistor). This reduces the amount of current needed to program the bitcell, thereby allowing for the use of a comparatively smaller charge pump (e.g., relative to the size of a charge pump needed in the capacitor and transistor example). During programming, the first active region is held to a low voltage, for example between 0-2 V in order to prevent write disturb, in this case injection onto the floating gate via BTBT during programming.

To read the voltage on floating gate, the capacitor is brought to voltage sufficient to couple the floating gate of erased bits (e.g., bits having a sufficiently positive charge) up significantly above the AT's $V_T$, which in one embodiment is in the 3 V range. For selected rows, a drain to source voltage $V_{ds}$ is set so that erased bits produce enough current for sense amplifiers coupled to the AT to read the logical state of the floating gate in a specified amount of time. In one embodiment the drain is set to a low voltage such as 0V and the source is set to a higher voltage such as 1.2V, creating a read voltage differential. In another embodiment the drain is set to 1.2V and the source is set to 0V. Due to the erased bits having a significantly higher (e.g., more positive) voltage than the programmed gates, peripheral circuitry should be able to distinguish the erase bits from the program bits, correctly reading a 0 or 1 logical state. For unselected rows, capacitor is held at ground, and as a result the ATs of those are off (that is, below the $V_T$) for both erased and programmed bits.

For example, assume the bitcell has a threshold voltage $V_T$ of 0.5 V, where the threshold voltage $V_T$ is the voltage on the floating gate where the AT is turned on, causing current to flow between the source and the drain in channel 108 (assuming a sufficient differential in voltage between source and drain, such as the example 1.8V difference above). A logical state of 0 may be represented by a floating gate voltage of −1 V (assuming the source, drain, and capacitor are set to 0 V bias). In contrast, a logical state of 1 may be represented by a floating gate voltage of −3 V. In this example, when a read operation is performed, the source and capacitor are increased to positive voltages such as 1.8 V and 3 V, respectively. If the bitcell has a coupling ratio to the capacitor of 70% and a logical state of 0, due to capacitive coupling the voltage on the floating gate will be raised from −1V to 1.1V, exceeding the threshold voltage $V_T$ of 0.5 V. Consequently, the AT turns on and current flows through channel from the source to the drain. In contrast, if the bitcell has a logical state of 1, despite capacitive coupling the voltage on the floating gate will only be −0.9V after being raised from −3V, not exceeding the threshold voltage $V_T$ of 0.5V. Consequently, the AT does not turn on, and current does not flow through the channel from the source to the drain.

The NVM bitcell may also make use of adaptive read schemes which adjust the voltage on the capacitor to compensate for process-voltage-temperature (PVT) variations. PVT variations can affect the amount current provided during read. Repeated cycling (programming and erasing) can result in charge trapping at the interface between the channel and the gate oxide. Charge trapping can cause a shift in the threshold voltage $V_T$ of a bitcell, thereby affecting the performance of the bitcell. Adaptive read schemes may be used to compensate for erroneous bitcell performance due to PVT or charge trapping. In one embodiment, an adaptive read scheme is implemented by using a reference bitcell programmed to a logical state of 1 to set bias conditions such that a known read current is provided. The read current of the reference bitcell may be used to adjust the various voltages used to read the bitcell. The reference bitcell should behave the same as the bitcell under various PVT conditions. The adaptive read scheme may then adjust the capacitor voltage to compensate for any changes in the threshold voltage of the bitcell due to PVT variations. In one embodiment, reference bitcells are cycled with respect to row in a bitcell array to better mimic charge trapping behavior and therefore better control the adaptive read scheme.

Alternative Embodiments

Although the various embodiments of the NVM bitcell have been described with respect to a 5V CMOS logic process, in other embodiments the NVM bitcell may also be constructed according to a 3.3V, 2.5 V, or a 1.8V CMOS logic process. Other specifications of the NVM bitcell are expected to vary in these other CMOS logic processes, however the functionality and features of the bitcell remain the same across implementations.

In addition to being constructed using different CMOS logic processes, the NVM bitcell may be constructed with different implants for the AT. Table 2 sets forth several examples for combinations of implants that can be used to create functional ATs of the NVM bitcells according to various embodiments.

TABLE 2

Implant Combinations

| Implant | $V_T$ of AT | e− Injection | h+ injection | Notes |
|---|---|---|---|---|
| 5 V N-LDD (e.g., implant 160 in FIG. 1B) | Standard | Low | Low | Implant designed to handle 5 V operation without Hot Carrier Injection (HCI) or Gate Induced Drain Leakage (GIDL). Junction is graded |
| 1.8 V N-LDD and P-Halo (e.g., implants 152 and 156 in FIG. 1B) | High | High | High | Implant configured to reduce series resistance and reduce GIDL at 1.8 V. At higher voltages, GIDL and CHEI will occur in significant amounts |
| 1.8 V N-LDD, P-halo, and 5 V P-LDD (e.g., implants 252, 254, and 264 in FIG. 2) | Very High | Very High | Very High | Increases doping in halo region. Increases $V_T$, GIDL, and CHEI |
| 1.8 V N-LDD, P-halo, and 5 V N-LDD (e.g., implants 152, 156, and 160 in FIG. 1B) | Standard | Low | Low | 5 V N-LDD extends past the 1.8 V N-LDD and P-Halo. Consequently, a device with these implants functions similarly to the 5 V N-LDD implant case described in the first row of the table. |
| No LDD | Variable | High | High | The $V_T$ will changing depending upon whether N+ source/drain implants (e.g., 102/104) extend under the floating gate. If they do, the device will behave similarly to the 5 V N-LDD case described in the first row of the table. If they do not, the $V_T$ will be very high. |

A cell library incorporating one or more NVM bitcells or circuits as described above may be stored in the memory. The cell library may be referenced by the EDA software 912 to create a circuit or electronic device incorporating the NVM bitcells or circuits.

During system design 914, designers describe the functionality to implement. They can also perform what-if planning to refine the functionality and to check costs. Note that hardware-software architecture partitioning can occur at this stage. During logic design and functional verification 916, VHDL or Verilog code for modules in the circuit is written and the design is checked for functional accuracy. More specifically, the design is checked to ensure that it produces the correct outputs. During synthesis and design for test 918, VHDL/Verilog is translated to a netlist. This netlist can be optimized for the target technology. Additionally, tests can be designed and implemented to check the finished chips. During netlist verification 920, the netlist is checked for compliance with timing constraints and for correspondence with the VHDL/Verilog source code.

During design planning 922, an overall floor plan for the chip is constructed and analyzed for timing and top-level routing. Example EDA software products from Synopsys, Inc. of Mountain View, Calif. that can be used at this stage include: Astro® and IC Compiler® products. During physical implementation 924, the placement (positioning of circuit elements) and routing (connection of the same) occurs. During analysis and extraction 926, the circuit function is verified at a transistor level, which permits refinement. During physical verification 928, the design is checked to ensure correctness for: manufacturing, electrical issues, lithographic issues, and circuitry. During resolution enhancement 930, geometric manipulations of the layout are performed to improve manufacturability of the design. During mask-data preparation 932, the 'tape-out' data for production of masks to produce finished chips is provided.

Overview of Electronic Design Automation Design Flow

Figure 9:
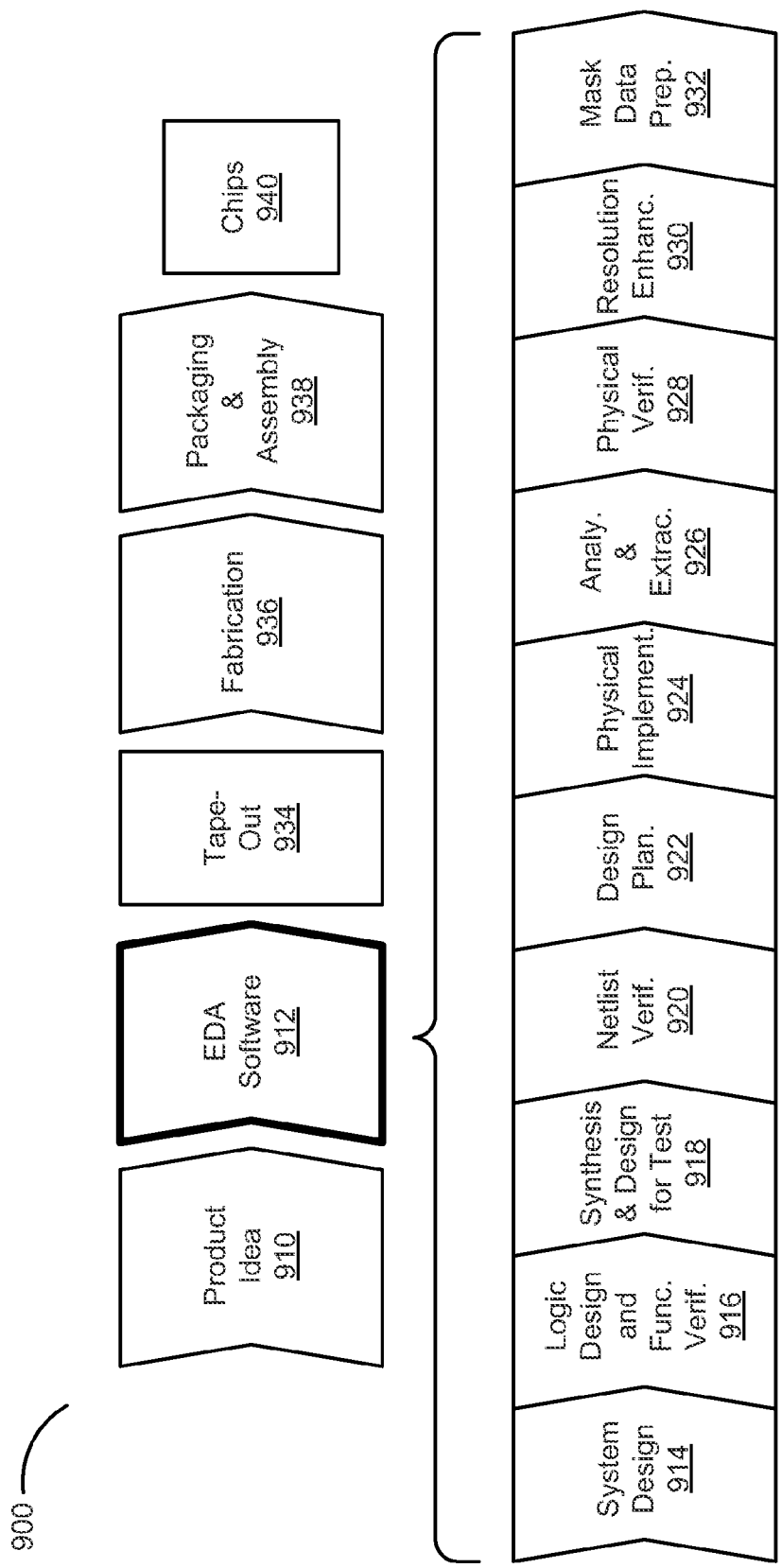
FIG. 9 is a flowchart illustrating the various operations in the design and fabrication of an integrated circuit such including the NVM bitcell, according to one embodiment.

FIG. 9 is a flowchart illustrating the various operations in the design and fabrication of an integrated circuit such including the NVM bitcell, according to one embodiment. This process starts with the generation of a product idea 910, which is realized during a design process that uses electronic design automation (EDA) software 912. When the design is finalized, it can be taped-out 934. After tape-out, a semiconductor die is fabricated 936 to form the various objects (e.g., a bitcell including gates, metal lines, vias) in the integrated circuit design. Packaging and assembly processes 938 are performed, which result in finished chips 940.

The EDA software 912 may be implemented in one or more computing devices including a memory. An example of a memory is a non-transitory computer readable storage medium. For example, the EDA software 912 is stored as instructions in the computer-readable storage medium which are executed by a processor for performing operations 914-932 of the design flow, which are described below. This design flow description is for illustration purposes. In particular, this description is not meant to limit the present disclosure. For example, an actual integrated circuit design may require a designer to perform the design operations in a difference sequence than the sequence described herein.

Embodiments of the present disclosure can be used during one or more of the above-described stages. Specifically, in some embodiments the present disclosure can be used in EDA software 912 that includes operations between design planning 922 and physical implementation 224.

Additional Considerations

Figure 10:
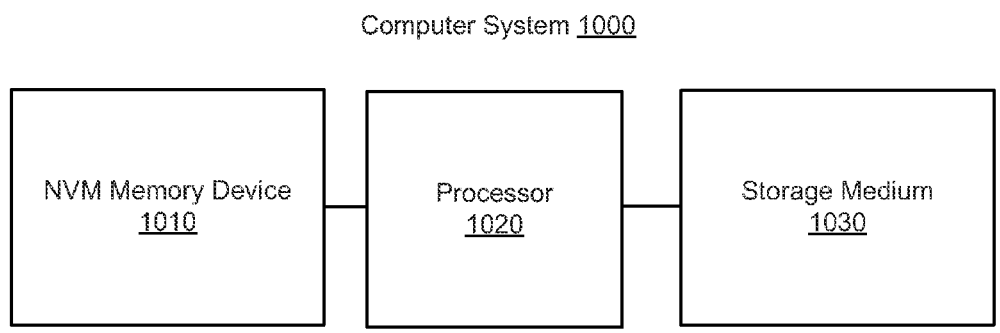
FIG. 10 is a block diagram illustrating a computer system including an NVM memory device, according to one embodiment.

FIG. 10 is a block diagram illustrating a computer system 1000 including an NVM memory device, according to one embodiment. The computer system 1000 includes an NVM memory device 1010, a processor 1020, and a tangible, non-transitory computer readable storage medium 1030. The storage medium comprises a set of computer code instructions for how the NVM memory device 1010 is to be operated. Specifically, it contains instructions on performing program, read, and erase operations with the bitcells of the NVM memory device 1010. The instructions may be embodied in storage medium in physical circuits, a field programmable gate array, firmware, or software. The processor 1020 accesses the instructions stored in the storage medium 1030 to perform program, read, and erase operations with the NVM memory device 1010.

Upon reading this disclosure, a reader will appreciate still additional alternative structural and functional designs through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A non-volatile memory bitcell comprising:
 a gated diode device comprising:
  a first portion of a floating gate,
  an anode in a first active region of a substrate beneath the first portion of the floating gate, the anode having a doping of a first conductivity type, and
  a cathode in the first active region of the substrate beneath the first portion of the floating gate, the cathode having a doping of a second conductivity type of opposite polarity to the first conductivity type, the applying of a reverse bias band to band tunneling (BTBT) voltage to the anode or the cathode causing charge carriers to transition to the floating gate;
 a transistor comprising:
  a second portion of the floating gate,
  a source in a second active region of the substrate beneath the second portion of the floating gate, and
  a drain in the second active region, the source and drain having dopings different from each other, a current flowing between the source and drain based on a voltage level of the floating gate and a voltage difference between the source and the drain; and
 a capacitor comprising:
  a first plate formed in a third active region of the substrate, and
  a second plate comprising a third portion of the floating gate above the third active region, the third portion of the floating gate capacitively coupling the floating gate to the third active region to control charge carrier transition and current between the source and the drain.

2. The non-volatile memory bitcell of claim 1, wherein the first, second, and third portions of the floating gate are electrically coupled together.

3. The non-volatile memory bitcell of claim 1, wherein the first active region, the second active region, and the third active region are separated by nonconductive regions.

4. The non-volatile memory bitcell of claim 1, wherein the bitcell is fabricated using a standard complementary metal oxide semiconductor (CMOS) logic process.

5. The non-volatile memory bitcell of claim 1, wherein the first active region comprises a first well implant, and the second active region comprises a second well implant, the first and second well implants having a same polarity.

6. The non-volatile memory bitcell of claim 1, wherein the first active region comprises a first well implant, and the second active region comprises a second well implant, the first and second well implants having different polarities.

7. The non-volatile memory bitcell of claim 1, wherein the cathode doping comprises an lightly doped drain (LDD) implant of the second conductivity type, and a halo implant of a first conductivity type.

8. The non-volatile memory bitcell of claim 7, wherein the anode doping comprises a LDD implant of the second conductivity type.

9. The non-volatile memory bitcell of claim 7, wherein the cathode doping further comprises another LDD implant of the first conductivity type.

10. The non-volatile memory bitcell of claim 1, wherein a first width of the anode is different than a second width of the cathode.

11. The non-volatile memory bitcell of claim 1, wherein the first active region comprises a nonlinear perimeter boundary beneath the first portion of the floating gate.

12. The non-volatile memory bitcell of claim 1, wherein the first portion of the floating gate comprises a poly dip that dips within a nonconductive region at a junction with the first active region, the poly dip extending below a surface plane of the first active region.

13. The non-volatile memory bitcell of claim 1, wherein the anode is electrically shorted to the substrate.

14. The non-volatile memory bitcell of claim 1, wherein the anode is electrically shorted to anodes of a plurality of other bitcells.

15. The non-volatile memory bitcell of claim 1, wherein the source comprises at least one of a lightly doped drain (LDD) implant and a source drain (S/D) extension implant of a first conductivity type and a halo implant of a second conductivity type.

16. The non-volatile memory bitcell of claim 1, wherein the third active region comprises a well implant.

17. The non-volatile memory bitcell of claim 1, wherein the third active region is formed in a native region.

18. The non-volatile memory bitcell of claim 1, wherein at least one of the capacitor and the gated diode device are formed in a shallow well.

19. The non-volatile memory bitcell of claim 1, wherein the gated diode device has an LDD implant of a same conductivity type as a well it is formed in.

20. The non-volatile memory bitcell of claim 1, wherein the first active region comprises a change of direction beneath the first portion of the floating gate.

21. A non-transitory machine readable medium that stores data representing a non-volatile memory bitcell that comprises:
 a gated diode device comprising:
  a first portion of a floating gate,
  an anode in a first active region of a substrate beneath the first portion of the floating gate, the anode having a doping of a first conductivity type, and a cathode in the first active region of the substrate beneath the first portion of the floating gate, the cathode having a doping of a second conductivity type of opposite polarity to the first conductivity type, the applying of a band to band tunneling (BTBT) voltage to the anode or the cathode causing charge carriers to transition to the floating gate;

a transistor comprising:
  a second portion of the floating gate,
  a source in a second active region of the substrate beneath the second portion of the floating gate, and
  a drain in the second active region, the source and drain having dopings different from each other, a current flowing between the source and drain based on a voltage level of the floating gate and a voltage difference between the source and the drain; and a capacitor comprising:
  a first plate formed in a third active region of the substrate, and
  a second plate comprising a third portion of the floating gate above the third active region, the third portion of the floating gate capacitively coupling the floating gate to the third active region to control charge carrier transition and current between the source and the drain.

\* \* \* \* \*